(12) United States Patent
Connell

(10) Patent No.: US 9,318,289 B2
(45) Date of Patent: Apr. 19, 2016

(54) SWITCHING CONTACTOR

(71) Applicant: Johnson Electric International (UK) Limited, Boldon, Tyne and Wear (GB)

(72) Inventor: Richard Anthony Connell, Shatin (HK)

(73) Assignee: JOHNSON ELECTRIC INTERNATIONAL (UK) LIMITED, Boldon, Tyne and Wear (GB)

( * ) Notice: Subject to any disclaimer, the term of this patent is extended or adjusted under 35 U.S.C. 154(b) by 426 days.

(21) Appl. No.: 13/736,697

(22) Filed: Jan. 8, 2013

(65) Prior Publication Data
US 2013/0176017 A1  Jul. 11, 2013

(30) Foreign Application Priority Data

Jan. 9, 2012  (GB) .................................. 1200331.5

(51) Int. Cl.
| | | |
|---|---|---|
| G01R 11/04 | (2006.01) | |
| H01H 50/54 | (2006.01) | |
| H01H 1/54 | (2006.01) | |
| H01H 50/64 | (2006.01) | |
| H02B 1/42 | (2006.01) | |
| H01R 13/64 | (2006.01) | |
| H01H 1/021 | (2006.01) | |

(52) U.S. Cl.
CPC ............... *H01H 50/54* (2013.01); *G01R 11/04* (2013.01); *H01H 1/021* (2013.01); *H01H 1/54* (2013.01); *H01H 50/641* (2013.01); *H01H 50/648* (2013.01); *H01R 13/64* (2013.01); *H02B 1/42* (2013.01); *H01H 2205/002* (2013.01)

(58) Field of Classification Search
CPC . H01H 51/2209; H01H 50/546; H01H 50/54; H01H 15/102; H01H 71/08; H01H 9/32; G01D 4/004; G01D 4/008; G01R 11/04; G01R 22/00; G01R 1/04; G06Q 50/06

USPC ......... 324/76.11, 72, 116, 157; 335/106, 107, 335/121; 307/24, 112, 125, 126

See application file for complete search history.

(56) References Cited

U.S. PATENT DOCUMENTS

| | | | | | |
|---|---|---|---|---|---|
| 2,100,467 | A | * | 11/1937 | Borden | G08C 19/12 307/140 |
| 2,869,071 | A | * | 1/1959 | Esterson | G01N 27/023 324/445 |
| 3,050,603 | A | * | 8/1962 | Concelman | H01P 1/125 200/504 |
| 3,164,771 | A | * | 1/1965 | Milford | G01D 4/004 324/113 |
| 4,240,030 | A | * | 12/1980 | Bateman | G01R 21/00 235/449 |
| 4,430,579 | A | * | 2/1984 | Wiktor | H01H 50/32 307/116 |
| 4,902,965 | A | * | 2/1990 | Bodrug | G01R 21/1331 324/116 |
| 4,980,794 | A | * | 12/1990 | Engel | G01R 15/183 318/474 |
| 5,572,396 | A | * | 11/1996 | Robinson | G01R 1/36 361/117 |
| 5,952,739 | A | * | 9/1999 | Grass | H01H 3/26 200/51.17 |

(Continued)

FOREIGN PATENT DOCUMENTS

DE        20310954 U1    9/2003

*Primary Examiner* — Arleen M Vazquez
*Assistant Examiner* — Sean Curtis
(74) *Attorney, Agent, or Firm* — Muncy, Geissler, Olds & Lowe PC

(57) ABSTRACT

A switching electrical power contactor having a bi-blade type switch, has ferrous plates attached to the blades to increase the current carrying capacity and reduce the resistance of the switch. The contactor is incorporated on the outside of a mains meter enclosure or in a wall box for a mains meter, within the space defined by the sprung jaws of the meter socket.

19 Claims, 9 Drawing Sheets

(56) References Cited

U.S. PATENT DOCUMENTS

| | | | | |
|---|---|---|---|---|
| 6,104,586 | A * | 8/2000 | Robinson | H01H 83/20 361/102 |
| 6,292,075 | B1 * | 9/2001 | Connell | H01H 50/20 335/132 |
| 6,906,637 | B2 * | 6/2005 | Martin | G01D 4/004 340/12.32 |
| 7,130,722 | B2 * | 10/2006 | Soni | H02J 3/14 700/286 |
| 7,362,232 | B2 * | 4/2008 | Holle | G01R 22/066 324/110 |
| 7,780,457 | B2 * | 8/2010 | Schafer | H01R 4/4818 439/76.1 |
| 7,833,034 | B2 * | 11/2010 | Connell | H01H 1/54 439/251 |
| 7,990,239 | B2 * | 8/2011 | Brown | H01H 1/54 200/16 R |
| 8,226,427 | B2 * | 7/2012 | Connell | H01H 1/54 439/251 |
| 8,279,027 | B2 * | 10/2012 | Brown | H01H 51/2209 335/167 |
| 8,845,350 | B2 * | 9/2014 | Connell | G01R 11/04 200/61.19 |
| 2003/0086218 | A1 * | 5/2003 | Folliot | H01H 79/00 361/37 |
| 2003/0158677 | A1 * | 8/2003 | Swarztrauber | G01D 4/008 702/62 |
| 2005/0174256 | A1 * | 8/2005 | Berg | G08C 17/02 340/870.39 |
| 2005/0264390 | A1 * | 12/2005 | Turner | H01H 37/5427 337/36 |
| 2008/0180885 | A1 | 7/2008 | Loehr et al. | |
| 2008/0186126 | A1 * | 8/2008 | Ying | H01H 9/32 337/333 |
| 2009/0096558 | A1 * | 4/2009 | Lange et al. | 335/131 |
| 2009/0219119 | A1 * | 9/2009 | Lefebvre | 335/202 |
| 2009/0279217 | A1 * | 11/2009 | Curl | H02H 3/334 361/42 |
| 2009/0294260 | A1 * | 12/2009 | Makinson | G01R 1/04 200/61.19 |
| 2009/0318000 | A1 * | 12/2009 | Connell | H01H 1/54 439/251 |
| 2010/0282579 | A1 * | 11/2010 | Brown | H01H 1/54 200/271 |
| 2011/0037543 | A1 * | 2/2011 | Lange | 335/127 |
| 2011/0095853 | A1 * | 4/2011 | Connell | H01H 1/54 335/189 |
| 2012/0218684 | A1 * | 8/2012 | Andersen | H02B 1/20 361/601 |
| 2013/0181793 | A1 * | 7/2013 | Bauer et al. | 335/133 |

* cited by examiner

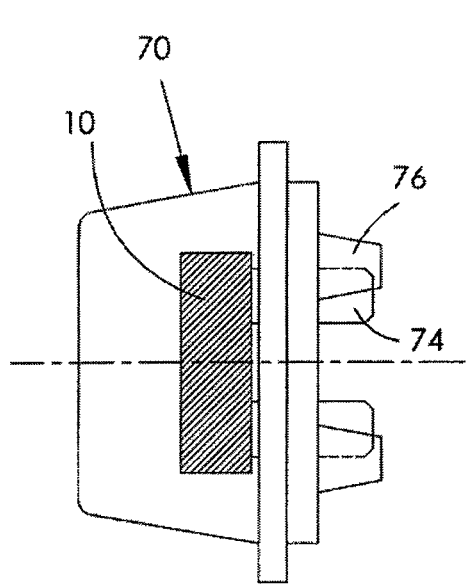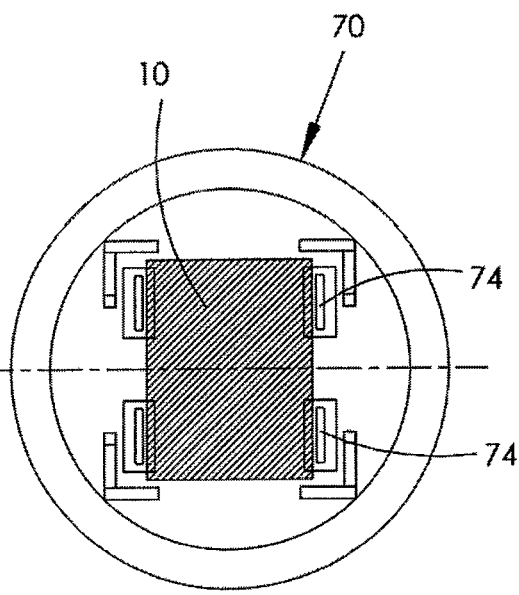
FIG. 13  FIG. 14
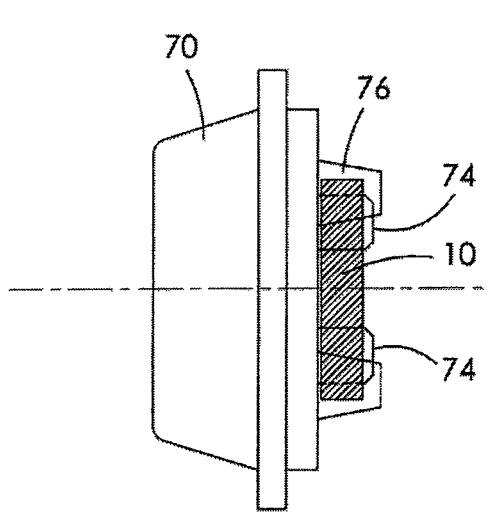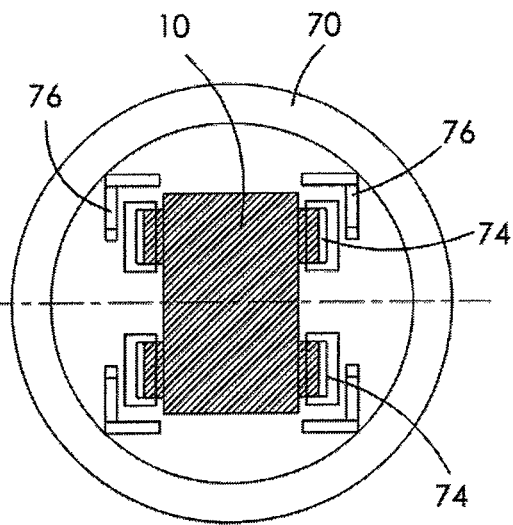
FIG. 15  FIG. 16

SWITCHING CONTACTOR

CROSS REFERENCE TO RELATED APPLICATIONS

This non-provisional patent application claims priority under 35 U.S.C. §119(a) from Patent Application No. GB1200331.5 filed in United Kingdom on Jan. 9, 2012.

FIELD OF THE INVENTION

This invention relates to an electrical power switching contactor and in particular, to a single-pole or two-pole contactor capable of switching currents of more than 80 amps at mains voltage.

This invention also relates to the types of high-current switching contactors employed in modern electricity meters, so-called "smart meters", for performing a pre-payment or safety-disconnect function at normal domestic supply (mains) voltages, e.g. 100 V AC to 240 V AC. It has a particular application to electrical contactors having a bi-blade contact arrangement as described in U.S. Pat. No. 7,833,034.

BACKGROUND OF THE INVENTION

Many contactors of this type are capable of switching nominal current at say 100 Amps or 200 Amps, for a large number of switching load cycles, satisfactorily, the switching being done by suitable silver-alloy contacts containing certain additives, which prevent welding. The switching blades are configured to be easily actuated for the switching function, with minimal self heating at the nominal currents concerned.

Most meter specifications not only stipulate satisfactory Nominal-current Endurance switching—without the contacts welding—but also demand that at moderate short-circuit fault conditions they must also not weld, and must open on the next actuator-driven pulse. At much higher related "dead-short" conditions the switch contacts may weld, but must remain intact, not explode or emit any dangerous molten material during the "dead-short" duration, until protective fuses rupture, or circuit breakers drop-out and disconnect the mains supply to the load, safely. This shorting duration may be for a maximum of 6 cycles of the mains supply.

U.S. Pat. No. 7,833,034 introduced the basic configuration of the "bi-blade" switch comprising a pair of parallel movable spring-copper arms or blades, of a particular thickness, width and active length, with a small defined gap there between. The blades' fixed ends are terminated together by rivets, screws, or semi-shears, to a moving-blade-carrier terminal, with movable contacts attached on the inner faces of the free ends, which close naturally on fixed contacts attached to the other fixed-blade-carrier terminal of the switch.

In the basic embodiment, the contactor uses a bi-blade switch construction, in which the switch has a pair of movable arms (also known as blades), which are strip-punched and pre-formed so that they close on the fixed contacts with a defined "contact-pressure" force—for achieving a relatively low switch resistance—and the open ends are formed outwardly with a sloping portion. The arms extend parallel to each other and separated by a small gap so that under high current situations the currents through the arms create forces of magnetic attraction urging the arms towards each other and increasing the force applied to the fixed contacts disposed between the distal ends of the arms. This force of attraction offsets the repulsive force urging the contacts apart, and is also due to the high current passing through the contacts. This arrangement is shown in FIGS. 1 to 3. FIGS. 1 & 2 show a single-pole contactor 10 with the cover removed to show the workings. FIG. 3 is a schematic view of the arms 30 of one switch. Each arm has a strip of spring copper having a first end 34 attached to a first terminal 24, known as the movable terminal as it is connected to the movable arms. A second terminal 22, known as the fixed terminal has fixed contacts 23. The distal end 36 of each arm is fitted with a movable contact 25. Each arm 30 has a sloping section or portion 38 to create an offset between the ends of the arms such that the fixed contacts can be accommodated between the movable contacts. The two arms extend parallel to each other except at the sloping portion. The movable contacts are arranged to align with the fixed contacts and in the relaxed state of the arms, the movable contacts bear against the fixed contacts with a predetermined contact force. The arms are able to move or flex within the plane of the drawing about the connection to the first terminal. A rib 39 is formed in the arms to stiffen the arms against excessive flexing.

The basic parallel "bi-blade" configuration, as used in a 100 Amp nominal current contactor, creates dynamic magnetic blade forces in excess of the contact repulsion forces during short-circuit faults. The blade geometries and contacts were optimised to avoid welding at the specified operating conditions. This basic 100 Amp switch uses 4 contacts; two movable and two fixed, with 50 Amps in each parallel blade. This basic arrangement was not capable of withstanding much higher nominal and short-circuit currents, as the blade geometries and current-sharing parameters limited the balancing of the blade forces and particularly the greater contact repulsion forces, resulting in much lessened endurance life, and serious contact welding issues during higher short-circuit faults.

U.S. Pat. No. 7,833,034 also introduced the divided blade concept, allowing a 200 Amp nominal current contactor able to balance the dynamic magnetic blade forces and contact repulsion forces during short-circuit faults, the geometries and contacts being optimised to avoid welding at the specified conditions.

To evenly share the current sharing—and to balance the repulsive contact forces and blade magnetic attraction forces—each adjacent parallel "bi-blade" was sub-divided into longitudinal half-blades, with a movable contact at each of their free ends, mating with respective fixed contacts, thus constituting 4 half-blades in parallel with 8 contacts per switch, or 16 in total for the 2-pole, two-phase disconnect contactor. This lower current sharing in each half-blade significantly reduces the contact repulsion forces.

Thus at 200 Amps, each half-blade will be carrying only 50 Amps, reducing the burden per half-blade when switched, minimising self heating, and avoiding welding at the higher nominal and short-circuit currents. Importantly, all half-blade currents flow in the same direction, thus maximising the magnetic attraction forces between half-blades in the working gap, especially at high current, to keep the contacts tightly closed.

The existing 100 Amp switch designs using simple parallel spring-copper "bi-blades" are very limited by the geometries and gap between, each blade in the "bi-blade" set being capable of generating certain magnetic attraction forces at high shared current, one with-respect-to the other, balanced and acting against the contact repulsion forces—both being proportional to the square of the current—in order to ensure that the contacts remain closed during short-circuit faults. It is very difficult to get this balanced ratio of forces exactly right for a particular configuration. Hence the divided blade version was optimised for use at 200 Amps, but used longer blades and 16 contacts in total.

The divided bi-blade configuration provided a good solution for the 200 Amp contactor but at a price as the silver contacts are expensive and the divided blades take up space. There is also a market want for the 100 Amp and 200 Amp contactors to be made smaller to save space. Thus there is a desire to reconfigure the simpler, basic parallel "bi-blade" 100 Amp switch geometry and configuration, so it was capable to operate at the higher 200 Amps nominal current with a greater short-circuit capability, in full compliance with various National requirements such as the ANSI C12.1 meter-disconnect specification.

Certain embodiments of the present invention provide a smaller, simpler, cost-reduced switch, using a new "bi-blade" switch arrangement, which not only uses less copper blade material, but requires only 8 switching contacts per 2-pole contactor instead of the current 16 required in the present design for a contactor rated at 200 Amps nominal current. Silver-alloy contacts represent a significant proportion of all high-current contactor cost breakdowns, so a reduction in the number of contacts required for a particular switching function is a major cost-saving benefit. Teachings from the improvements to the 200 Amp contactor can be applied to contactors rated at 100 Amps or less, to reduce its size.

SUMMARY OF THE INVENTION

Accordingly, in one aspect thereof, the present invention provides a meter and contactor assembly, comprising: a 2-phase mains meter; a meter housing accommodating the mains meter; and a 2-pole power contactor, having two switches connected between four terminals for switching the current in the two phases, wherein the meter has four meter terminals, a first two meter terminals are in the form of stabs which extend through a rear wall of the housing and arranged to be inserted in a plug-in terminal block of a wall box, and the contactor is fitted to an outer surface on the rear wall of the housing and disposed within a space defined by the terminals of the terminal block, a first two contactor terminals being in the form of stabs arranged to be inserted in respective terminals of the terminal block, a second two terminals of the contactor being connected to a second two terminals of the meter.

Preferably, the meter housing has four legs extending from the rear wall and arranged to limit the distance the stabs can be inserted into the plug-in terminals of the terminal block.

Preferably, the legs extend beyond the contactor.

Preferably, the legs are disposed laterally of the stabs and outside of a spaced defined by the stabs.

Preferably, each leg is disposed along side a respective slab.

According to a second aspect, the present invention provides a wall box and contactor assembly for a mains meter, the assembly comprising: an enclosure; a terminal block having plug-in terminals arranged to receive terminal stabs from a plug-in mains meter; and a contactor fitted to the enclosure and connected to the terminal block.

Preferably, the terminal block has a supply connection and a load connection, the supply connection is electrically connected to first terminals of the terminal block arrange to receive input terminal stabs of the mains meter, and the load connection is electrically connected to switched terminals of the contactor, and input terminals of the contactor are electrically connected to second terminals of the terminal block arranged to receive output terminal stabs of the mains meter, whereby, in use, the mains meter is directly connected to the supply and connected to the load via the contactor.

Preferably, a mains meter is releasably plugged into the terminal block.

Preferably, the contactor is disposed under the mains meter within the space defined by the plug-in terminals of the terminal block arranged to receive the terminal stabs of the mains meter.

BRIEF DESCRIPTION OF THE DRAWINGS

Preferred embodiments of the invention will now be described, by way of example only, with reference to figures of the accompanying drawings. In the figures, identical structures, elements or parts that appear in more than one figure are generally labeled with a same reference numeral in all the figures in which they appear. Dimensions of components and features shown in the figures are generally chosen for convenience and clarity of presentation and are not necessarily shown to scale. The figures are listed below.

FIG. 13 is a side view of a prior art meter enclosure;

FIG. 14 is a plan view of the meter enclosure of FIG. 14;

FIG. 15 is a side view of a meter enclosure according to the present invention;

FIG. 16 is a plan view of the meter enclosure of FIG. 15;

DETAILED DESCRIPTION OF THE PREFERRED EMBODIMENTS

Four important improvement concepts (the improvements) will now be described to illustrate the present invention. Each improvement will be discussed with reference to one or more preferred embodiments offered by way of example to describe the invention. While each concept can be combined with the teachings of the other concepts, certain concepts can be applied individually to prior art contactors of different construction.

Figure 1:
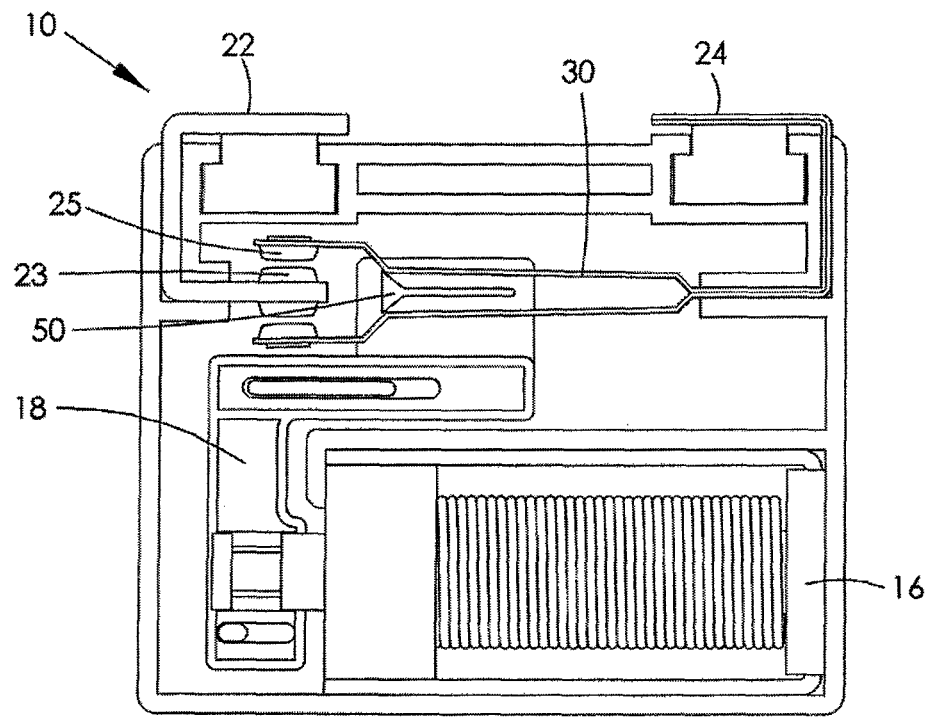
FIG. 1 is a plan view of a single pole contactor having bi-blade movable arms, according to the prior art, the contactor is shown with a cover removed.
Figure 2:
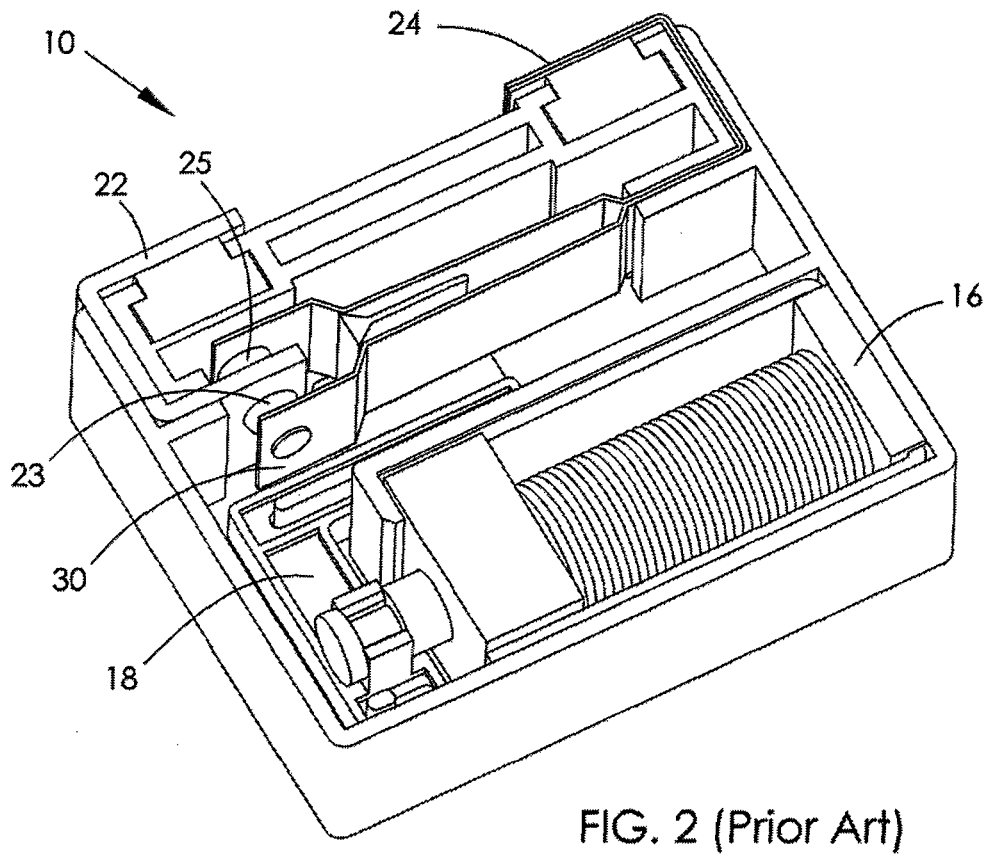
FIG. 2 is a perspective view of the contactor of FIG. 1.
Figure 3:
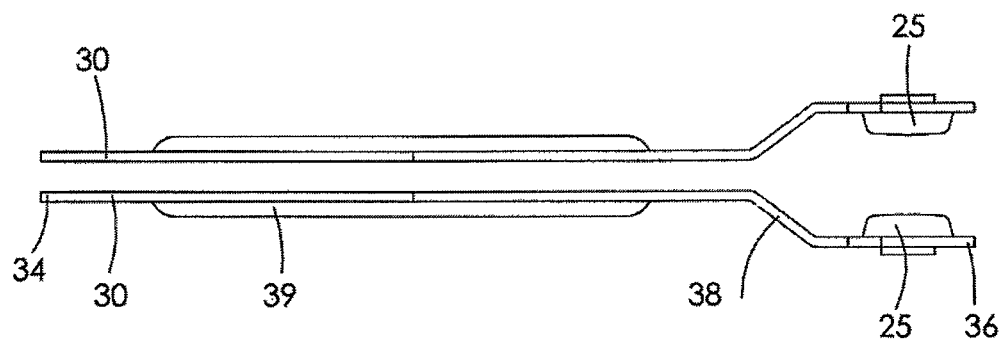
FIG. 3 is a schematic view of a pair of bi-blade movable arms according to the prior art.
Figure 4:
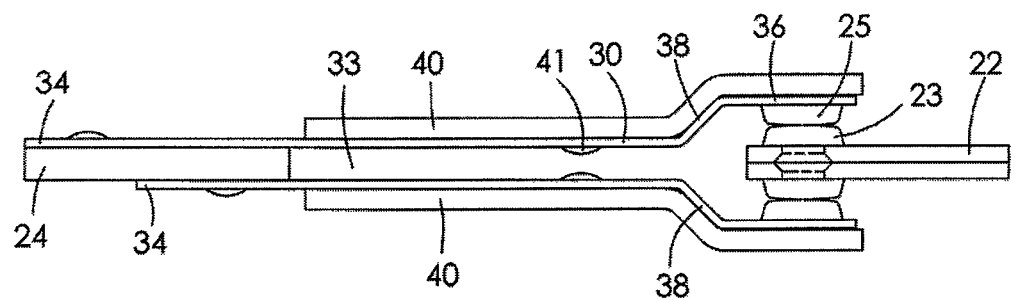
FIG. 4 is a schematic view similar to FIG. 3, of a pair of bi-blade movable arms according to the preferred embodiment of the present invention, engaging contacts of a fixed member.

FIG. 4 is a schematic view of a pair of bi-blade movable arms 30 of an electrical contactor, according to a preferred embodiment of the present invention. Each arm is similar to the prior art arms of FIG. 3 except that the stiffing ribs 39 are replaced by ferrous plates, in the form of steel laminations 40, intimately attached to the outer surface of the arm. The steel lamination 40 extends over a majority of the length of the arm 30 and preferably extends over the sloped portion 38 and the distal end 36 of the arm. In FIG. 4, the fixed terminal 22 and the fixed contacts 23 are shown disposed between the movable contacts 25 with the arms 30 in the relaxed state such that the contacts are engaged, known as the closed position. As before, the two arms 30 face each other across a small gap 33 for a majority of their length. The steel laminations allow the contact arms to be shorter for the same current rating and also reduces the resistance of the switch. The steel laminations 40 are fixed to the arms 30 by riveting, preferably using upset rivets 41 formed in the steel lamination and passing through holes in the arms.

This design allows the construction of a smaller, cost-reduced switch, with shorter, narrower spring-copper "bi-blades", which would have a lower nominal resistance and self heating, but which is also capable of generating much larger magnetic attraction forces, to overcome the inevitably larger contact Repulsion forces at the greater shared currents, with using fewer contacts.

With the standard, longer parallel copper "bi-blade" geometry, there is a defined magnetic attraction force between them at high shared short-circuit fault current, the strong individual magnetic fields being in close proximity to each other, across the gap, augmenting each other, creating some deflection (inwardly) in both, and closing the related gap at the same time. If the short-circuit fault current is very high—as for example during AC peaks—there is a danger that the blades may deflect too far, touch and possibly re-bound the contacts off, which will momentarily Open the switch and destroy the "bi-blade" effect, with potentially catastrophic explosive consequences.

Figure 4A:
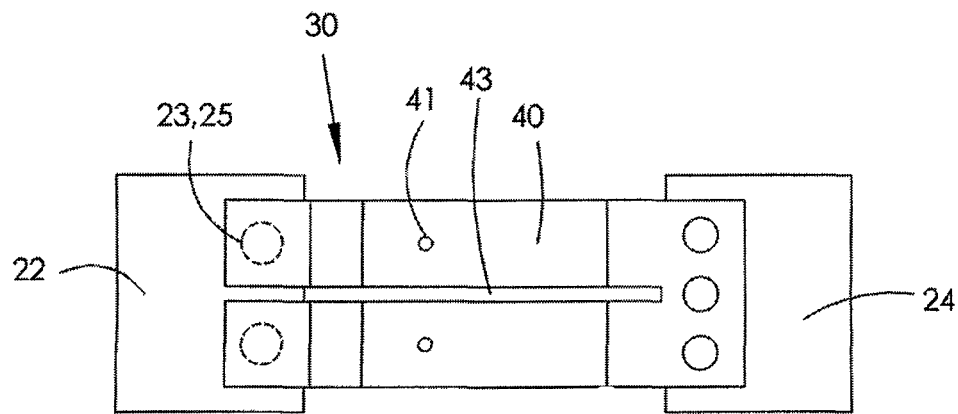
FIG. 4a is a plan view of a variation of the movable arms of FIG. 4.

FIG. 4a illustrates a variation of the blades shown in FIG. 4. While the steel enhanced bi-blade construction is designed to used using divided blades, for contactors with a very high current rating, over 200 Amps or for very compact contactors, a steel enhanced bi-blade switch arrangement may be useful, especially if the number of longitudinal sections can be reduced by using the steel laminations. Hence, in FIG. 4a is an example of a steel enhanced, divided, bi-blade switch of a contactor. The switch has a pair of bi-blade arms 30 extending from a movable terminal 24 to which they are riveted (only one visible), to a fixed terminal 22 having fixed contacts 23 opposing movable contacts 25 fixed to the distal ends of the arms. Each arm is divided into a plurality of longitudinal sections (two shown) by a slot 43 extending from the distal end towards the fixed end. Each longitudinal section has a steel lamination 40 fixed to an outer surface, preferably by use of an upset rivet 41.

Figure 5:
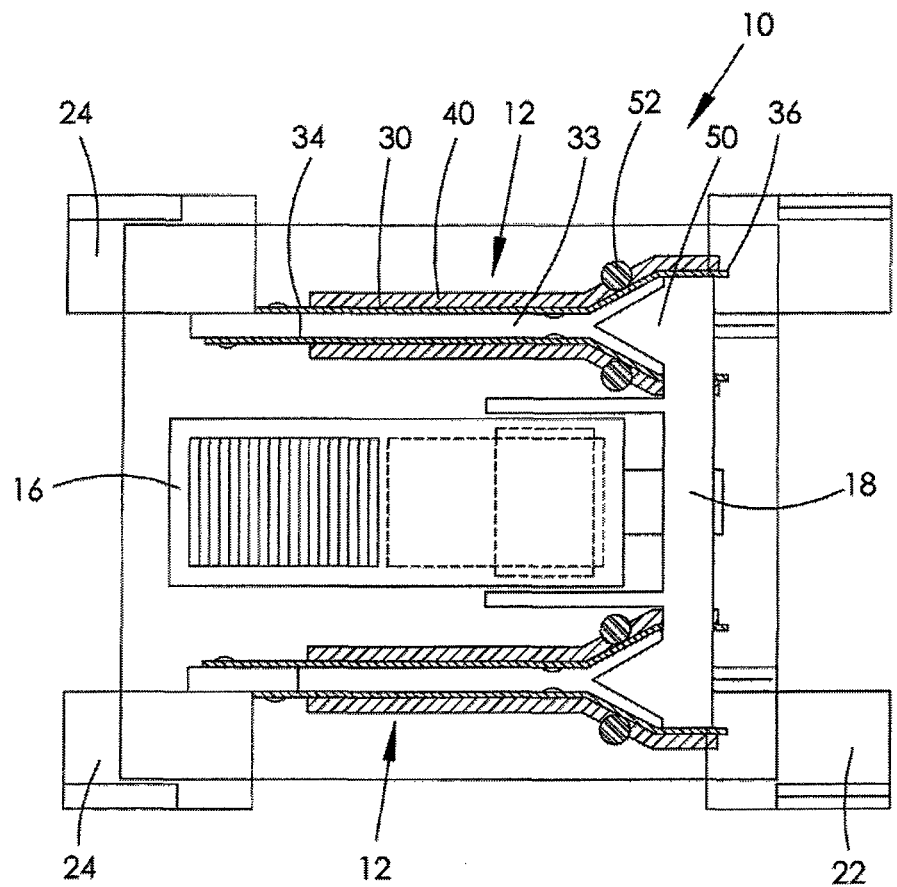
FIG. 5 is a plan view of a two-pole contactor incorporating the movable arms of FIG. 4, with a cover removed.

FIG. 5 illustrates a two-pole contactor 10 with a cover removed. The contactor has two switch sets 12, one on either side of a solenoid 16. A lifter 18 is fixed to a plunger of the solenoid and carries a wedge 50 and two pegs 52 for each switch. The wedge is disposed between the arms and arranged to separate the arms when driven into the gap 33. The two pegs 52 are disposed on opposite sides of the pair of arms in the region of the sloping portion 38. In the closed position as shown in FIG. 5, the pegs press against the outer surface of the sloping portion 38 of the arms, either directly or indirectly via the steel laminations, to urge the contacts to the closed position. When the solenoid moves the lifter to the open position, to the left as shown, the pegs disengage the arms allowing the contacts to open as the wedge enters into the gap 33 moving the distal ends of the arms apart opening the contacts. In FIG. 5, the contacts are obscured by the lifter 18, however opening and closing of the contacts can be seen in FIGS. 6 & 7.

The solenoid 16 may be a self latching solenoid, preferably a magnetic self latching solenoid which is pulse operated and spring biased to the closed position. Thus in operation, the solenoid is pulsed to change state, to latch in the open position or de-latch to the closed position. This saves energy as the solenoid is only momentarily energised to change positions.

The shorter, narrower steel-enhanced "bi-blades" give the advantage that the switch nominal resistance is typically halved, while the magnetic attraction forces between the movable arms are increased by at least a factor of five, as compared with the standard longer blades of the prior art.

The plug-in switch terminals or "stabs" for the standard 2-pole meter contactor, are normally tooled from 2.38 mm thick copper sheet or strip, for plugging-into the meter base sprung jaws. These copper tooled shapes generate considerable scrap loss. Since the steel-enhanced switch resistance is typically halved, it is possible to replace these copper terminals with brass terminals of the same thickness, achieving a further cost saving of approximately 40%, due to the price difference between copper and brass. FIG. 5 illustrates a 2-pole plug-in meter contactor incorporating the shorter, narrower steel-enhanced "bi-blades".

The 2-pole contactor has a symmetric layout of the two steel-enhanced switches with the centrally-placed solenoid 16, driving a lifter 18 attached to the solenoid plunger, having two wedges 50 for opening the blade sets. The terminal "stabs" 22, 24, enable the 2-pole contactor to be plugged into the meter socket. By making the terminal stabs out of brass instead of copper, the cost of the contactor is further reduced. The solenoid is preferably of a long narrow construction, disposed between the two sets of blades, to allow the contactor to have a relatively small width, allowing the contactor to fit between the sprung jaws of the meter socket so that the standard wall box and meter configuration can be used.

In the 2-pole contactor shown in FIG. 5, with shorter spring-copper "bi-blades", the presence of the stiffer steel laminations 40 attached intimately to the copper arms 30 has removed the flexibility seen in the standard blade design, which readily deflected inwardly under high short-circuit fault conditions, giving some contact wiping which reduced melt-pool tack-welding.

There is a concern that under high short-circuit fault conditions, stiffer arms such as the steel-enhanced bi-blades described above, may vibrate and bounce off briefly under the massive blade attraction and contact repulsion forces being balanced in the strong magnetic fields. Similarly, during nominal current switching, there is a concern that the rigid blades could generate some unwanted contact bounce, potentially causing tack welds, worsening endurance life and contact delamination.

Figure 6:
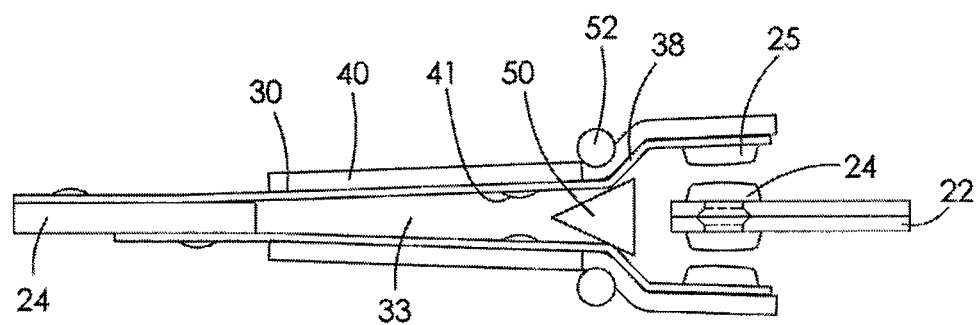
FIG. 6 is a schematic view, similar to FIG. 4, of a pair of bi-blade movable arms according to a second embodiment of the present invention, shown in the open position.
Figure 7:
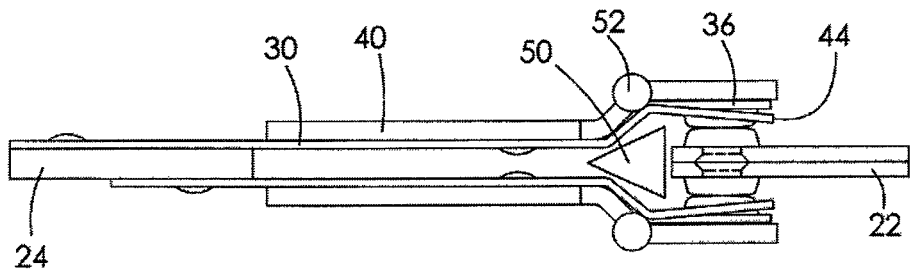
FIG. 7 is a schematic view, of the pair of bi-blade movable arms of FIG. 6, shown in the closed position.
Figure 8:
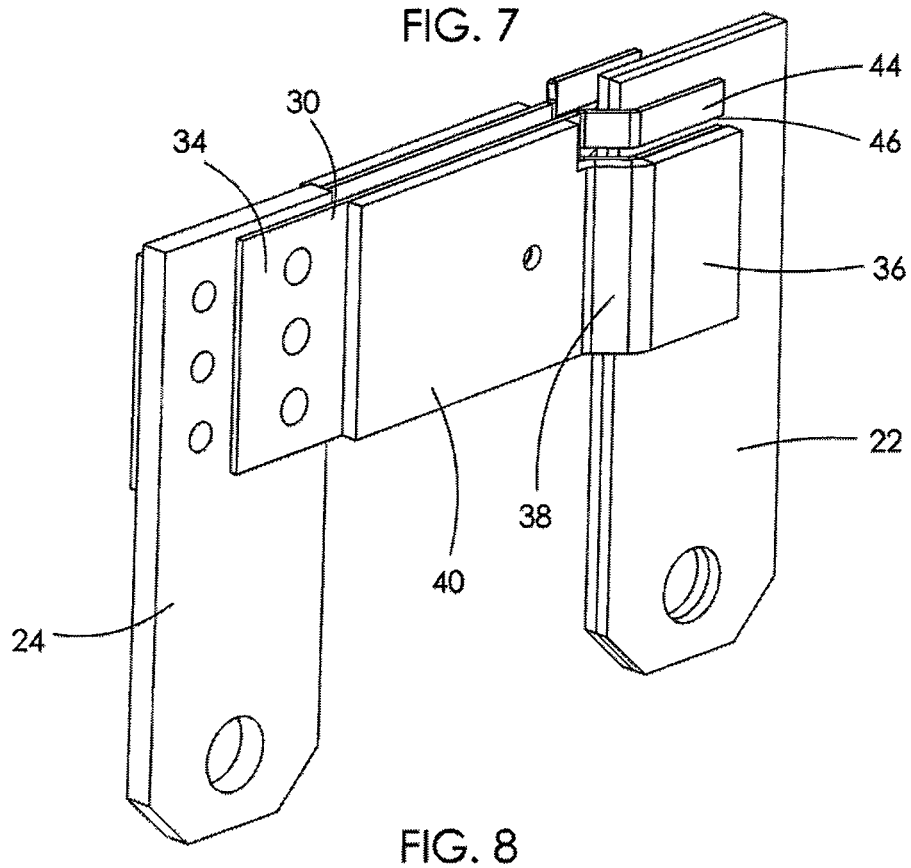
FIG. 8 is a schematic isometric view of the movable arms of FIG. 5 and the associated fixed member and terminals.

In order to eradicate these concerns, the contact or distal ends 36 of the arms 30 of the bi-blades are formed with a flexible tang 44 formed at one side as shown in FIGS. 6 to 8. As illustrated in FIGS. 5 and 6, the plunger of the solenoid 16 is attached to a lifter 18 with wedge shaped extensions (wedges 50) which are placed between the offset distal ends 36 of the blade pairs, so when the solenoid is driven, the blades and contacts are opened via the wedge being moved into the gap 33 between the arms and pressing against the inner blade faces of the sloping portion 38.

The lifter 18 also has pairs of "pegs" 52 which sit astride the outer sides of the sloping blade faces. The pegs 52 are spaced from the arms 30 when the lifter 18 is in the open position with the wedge 50 holding the arms apart. When the lifter is in the closed position, in which the wedge is disengaged from the arms, allowing the arms to close on the contacts, thus closing the switch, the pegs 52 engage with and deflect the tangs 44 inwardly, clamping the contacts gently so to prevent bounce. Also, during high "carrying" short-circuit and "dead-short" fault conditions, any vibration due to the massive blade attraction and contact repulsion forces being balanced, the peg 52 and tang 44 clamping reaction prevents bounce and spurious contact opening.

The tangs 44 are formed by making a longitudinal slit 46 in the distal end 36 of each arm, extending through the sloping portion 38 of the blade face. The tang does not contact the fixed contact and thus carries no current. While the tang is shown extending to the end of the arm, as the pegs only contact the sloping surface, the tang may be suitably modified and adjusted to provide a desired level of additional contact pressure. The tang is not covered by the steel plate 40.

The flexible tang concept, while shown as part of the steel enhanced bi-blade construction, could be applied to simple bi-blade switches to enhance the contact pressure and thus reduce normal contact resistance and improve resistance to contact bounce during contact closing.

In contactors described above, which use multi contacts (up to 16 in total) for even current sharing at Nominal current or high short-circuit fault levels, it is important that the contacts used have adequate "top-lay" silver-alloy thickness, in order to withstand the arduous current "switching" and "carrying" duties involved. Typical top-lay thickness of an 8 mm diameter bi-metal contact is in the range 0.6 to 1.0 mm, which equates to considerable cost, especially when 16 contacts are used in a 200 Amp, 2-pole contactor as used in prior art designs utilising a divided bi-blade construction.

One method of reducing the total silver-alloy cost is to control the top-lay thickness in some contacts of each switch, by introducing a special switching concept referred to as "lead/lag", which lends itself very well to the way the bi-blade arms are actually adjusted, set up and actuated during the pulse-driven switching function. This is even more important in the shorter-blade, steel-enhanced switch proposed above, which only uses 8 contacts instead of 16. The contacts will be sized to suit the Endurance life requirements.

With the "lead/lag" principle, as illustrated in FIGS. 9 to 13, chosen blades 30 and contacts 23, 24 in each set are adjusted and set up in such a way that during closing of the contacts a defined but critical time delay is introduced between the contacts that first closes (the "lead" contacts 60) taking the brunt of the switching load current, and the delayed contacts (the "lag" contacts 62) which closes a fraction later in time. This always ensures that the lag contacts only carry load current, keeping it relatively clean and hardly eroded. Thus the lag contacts 62 can have a much thinner top-lay silver-alloy thickness as compared with the lead contacts.

On the other hand, the lead contacts 60 taking the brunt of the switching load current (especially if the load is inductive) requires a thicker top-lay than the lag contacts, to enhance endurance life and reduce contact-delamination. Thus when the blade adjustment, set up and pulse-drive is optimised for lead/lag, it is possible to make considerable savings with the rationalised contacts as described.

It is possible, for example, to optimise a lead/lag contact set for relatively thick top-lay on the switching lead contacts, and much thinner top-lay on the carrying lag contact, making a considerable reduction in the silver-alloy content. Also the carrying lag contacts may be smaller in diameter.

Figure 9:
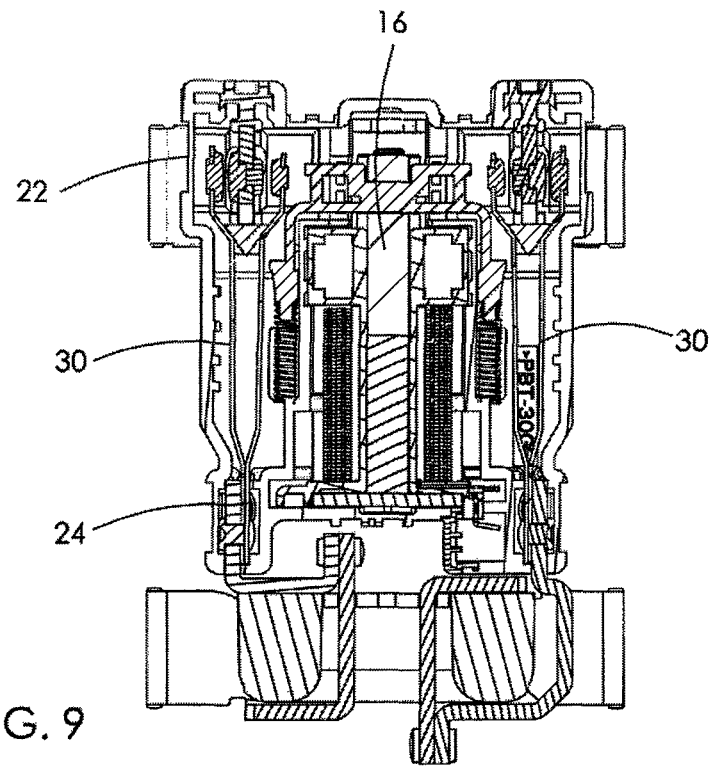
FIG. 9 is a schematic plan view of a two-pole contactor according to a third embodiment of the present invention.
Figure 10:
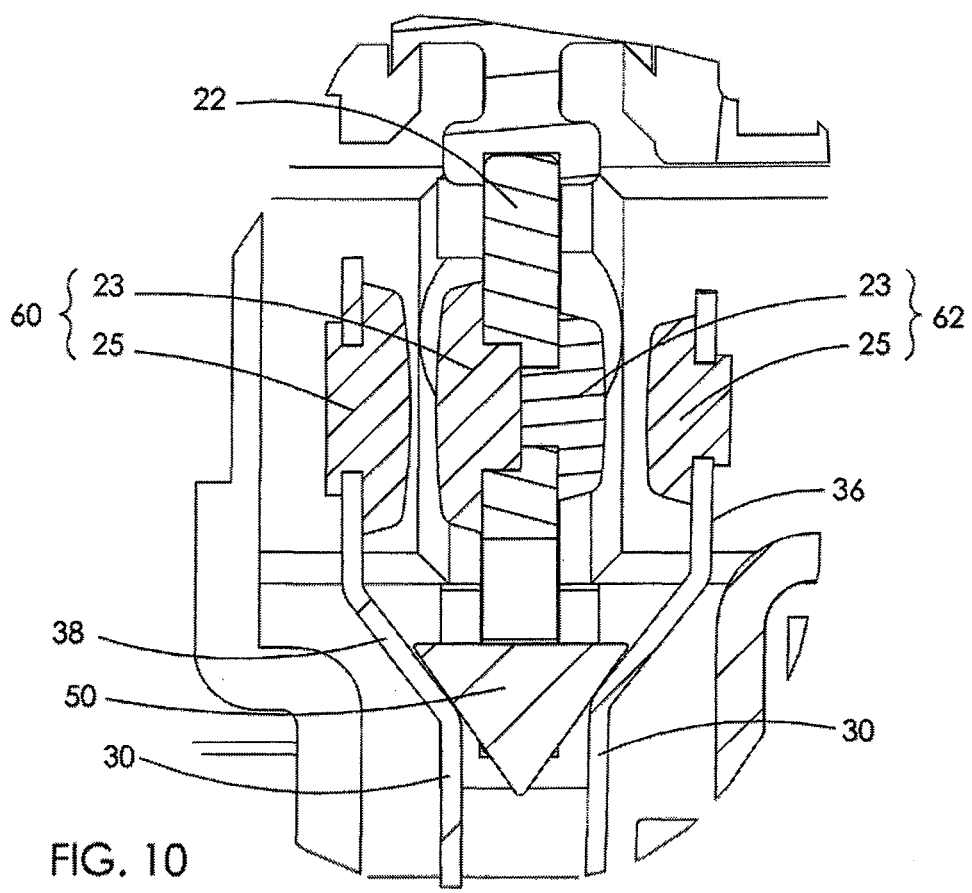
FIG. 10 is an enlarged partial view of the contactor of FIG. 9, showing the contacts of one pole in the fully open position.
Figure 11:
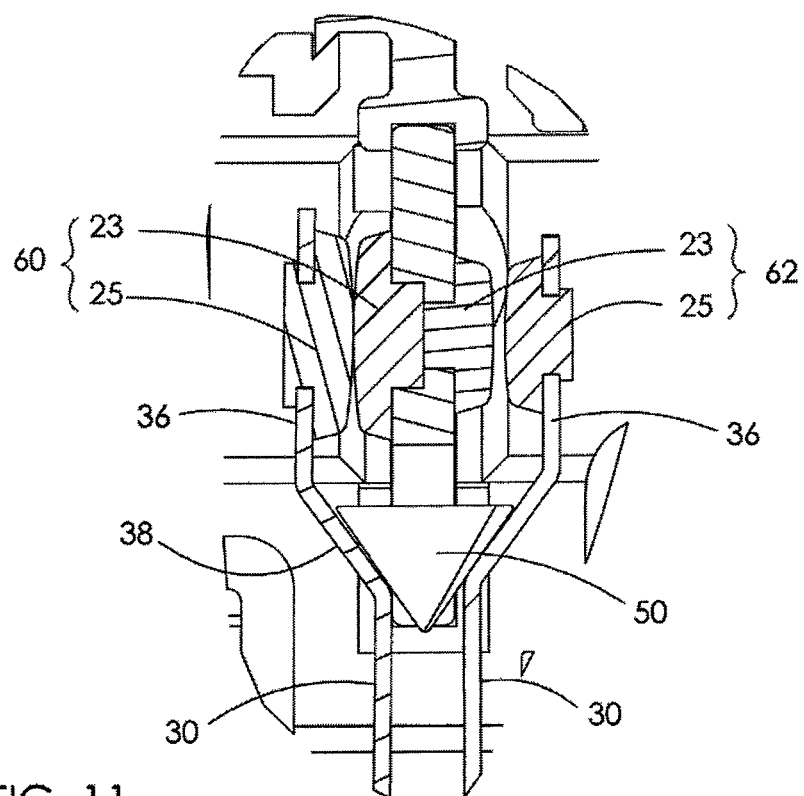
FIG. 11 is a view similar to FIG. 10, showing the contacts in the partially open position.
Figure 12:
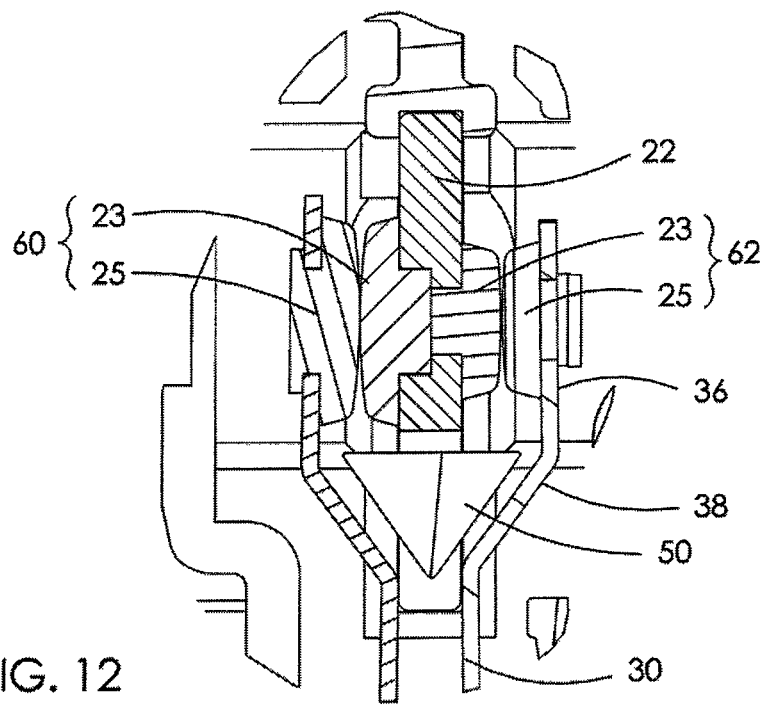
FIG. 12 is a view similar to FIG. 10, showing the contacts in the fully closed position.

In a simple arrangement, the wedge 50 which opens the arms 30 of the bi-blade switch, may be set slightly offset such that the wedge does not close the contacts or move the arms evenly. In particular, the wedge 50 will move one arm 30 slightly ahead of the other arm causing one arm, the lead arm, to close the switch (movable contact engages the fixed contact) slightly before the other arm, the lag arm, closes. FIG. 9 illustrates the switching mechanism of the contactor 10. FIGS. 10 to 12 are partial views which illustrate one set of switch contacts 23, 25, moving from the open position to the partially closed position and to the closed position, on an enlarged scale. In FIG. 10, the contacts are open with the wedge 50 holding the arms 30 apart, representing an open switch. In FIG. 11, the wedge 50 has moved to a position intermediate the open and close positions. At this position, one set of contacts, the lead set 60 have already made contact and thus the switch is closed. However, the other set of contacts, the lag set 62 are still held apart, thus no current can flow through the lag contacts 62. In FIG. 12, the wedge 50 has moved to the close position, releasing both arms 30 allowing both sets of contacts, the lead contacts 60, and the lag contacts 62, to close thus sharing the current flow through the switch.

In a 2-pole contactor, each switch may have a lead/lag contact arrangement as described above. Alternatively, as the two switches are effectively in series with the load between the supply terminals, one switch may be designated as the switching switch and the other switch as the carrying switch. In this case the carrying switch closes slightly before the switching switch so that it closes under a no current condition and the switching switch closes under full load conditions. Thus in terms of timing, the lead and lag roles are reversed but as before one set of contacts can be of lower current rating or using less expensive material, saving costs in the manufacture of the contactor. In this arrangement of 2-pole contactor, again the timing of the switching operation can be arranged by suitable positioning of the wedges which separate the arms, such that on release, one arm or one switch will close before the other.

Figure 18:
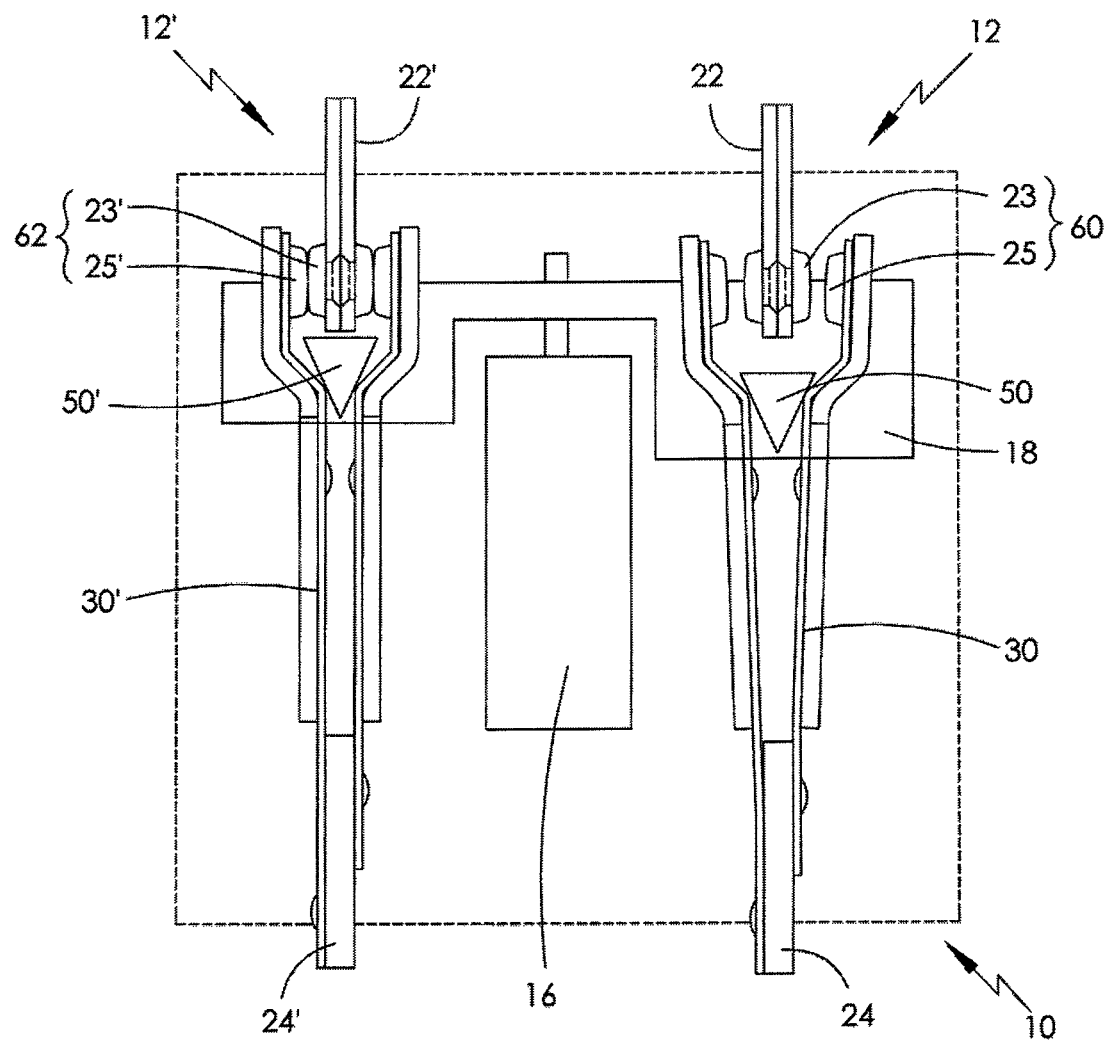
FIG. 18 is a schematic view of a 2-pole contactor having lead/lag switches.

FIG. 18 is a schematic diagram of a 2-pole contactor with lead contacts set at different switches. The contactor 10 has a first switch 12 and a second switch 12'. The first switch has a first terminal 22 carrying a fixed contact 23, a second terminal 24 connected to a first movable arm 30 carrying a movable contact 25 at an end remote from the connection to the second terminal. The fixed contact 23 and the movable contact 25 form a first switch pair of contacts 60. The second switch 12' is similarly constructed. The second switch has a third terminal 22' carrying a fixed contact 23', a fourth terminal 24' connected to a second movable arm 30' carrying a movable contact 25' at an end remote from the connection to the fourth terminal. The fixed contact 23' and the movable contact 25' form a second switch pair of contacts 62. A solenoid 16 moves a lifter 18 between first and second positions. A first wedge 50 integral with the lifter moves the first arm 30 to open and close the first switch. A second wedge 50' integral with the lifter moves the second arm 30' to open and close the second switch. The wedges are arranged, preferably by being offset, such that when the contactor closes, that is going from an open state to a closed state, the first switch pair of contacts 60 close after the second switch pair of contacts close. That is, there is a delay in the closing of the first switch compared with the second switch. In this configuration the contacts of the second switch take on the role of the lead contacts and handle the switching load while the contacts 23, 25 of the first switch 12 handle only carrying or load current and thus can be smaller. The contactor is shown with each switch having two arms but the concept works with switches having one or more arms.

There is a distinct cost advantage of incorporating a well adjusted and set up "bi-blade" set with "lead/lag" contacts as described above. If not properly pulse-driven, even at nominal current, some lead contacts can tack weld during operational life, since with the erosion that occurs, some points on the switched silver-alloy surface can become silver-rich, which promotes more tack-welding randomly. This is especially a problem if the pulse-drive is not strong enough to break the tack-welds that occur with switching bounce. Also depending on when this might happen through operational life, a tack-weld could occur during a moderate short-circuit fault for the same reasons.

One arrangement to improve this tack weld problem is to use a silver alloy top-lay which is tungsten rich. In particular, a special silver alloy top-lay with tungsten-oxide additive inclusions in the silver matrix, particularly for the lead switching contact. Addition of tungsten-oxide additive in the matrix has several important effects and advantages:

1) it creates a more homogeneous "top-lay" structure, puddling the eroding surface more evenly, but not creating as much silver-rich areas, prone to tack welding, 2) it raises the general melt-pool temperature at the switching point, which discourages tack-welding, and 3) because the tungsten-oxide additive is a fair proportion of the total "top-lay" silver mass, for a given thickness, there is also a small cost advantage.

All the improvements described above can be used to create a smaller, cost-reduced, meter-disconnect contactor, which would normally be mounted inside a meter casing. This improved design is smaller than all the existing meter-disconnect contactors, enabling it to be mounted not only inside the meter casing conventionally, but also to be moved outside of the meter envelope interface, either still attached to the under-side of the meter base enclosure, or integrated and nestled between and within the sprung jaws of the meter terminal block of the wall-box. The sprung jaws are the terminals of the meter socket that allow the mains meter to be simply plugged into the terminal block for easy installation and replacement. As such the sprung jaws are arranged according to a fixed conventional layout to allow compatibility between brands and models.

The schematic diagrams of FIGS. 13 & 14 show a typical plug-in meter arrangement with the existing, larger disconnect-contactor 10 mounted inside the meter enclosure 70, notionally plugged into sprung jaws of a meter socket in a "wall-box" for safely connecting the meter via it's copper terminal stabs to the supply and load cables mounted in the rear of the wall-box.

The existing larger meter-disconnect contactor mounted inside the plug-in meter enclosure as shown in FIG. 13 is too large to be mounted and attached below the meter-base molding, as the meter "stabs" 74 centers would not be compatible with the sprung jaw centers in the wall-box.

To fit between the stabs, the meter-disconnect contactor would have to be narrower, similar to the improved steel-enhanced contactor described above, for normal stab plugability of the meter into the wall-box sprung jaws, as shown in the schematic diagrams of FIGS. 15 & 16.

Figure 17:
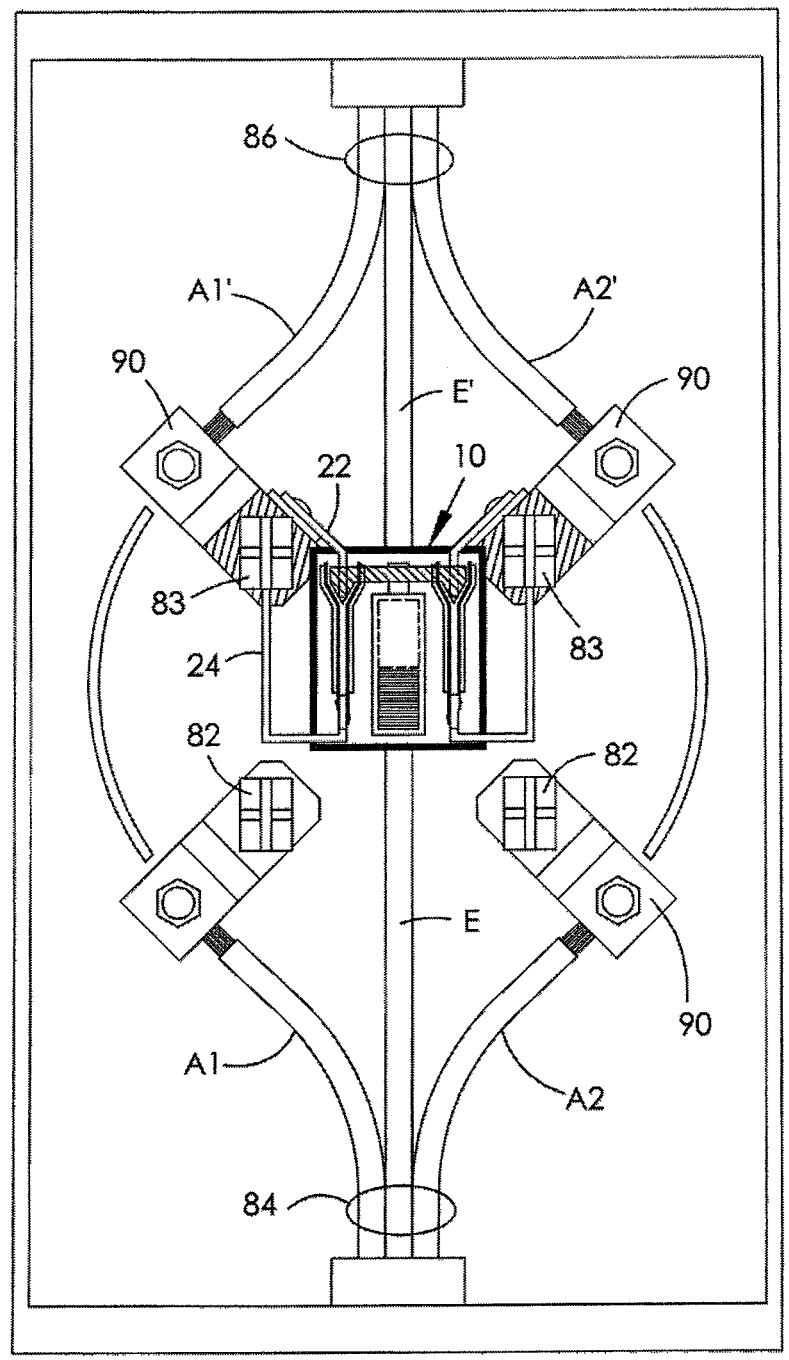
FIG. 17 is a schematic view of a wall box fitted with a disconnect meter according to the present invention.

The smaller meter-disconnect contactor 10 able to be produced using the improvements described above, is able to be mounted completely outside the meter enclosure 70, either on the back of the meter enclosure between the meter stabs as shown in FIGS. 15 & 16 or between the sprung jaws of the meter socket of the typical wall-box, as shown in FIG. 17, actually switching the sprung jaw connection.

In FIGS. 15 & 16, the contactor 10 is directed mounted to the back of the meter enclosure 70 between the terminal stabs 74 of the meter. Actually, two terminals of the contactor will be connected to two of the stabs. The meter enclosure 70 has four legs 76 which are disposed close to respective stabs but outside of the space defined by the stabs. The legs 76 provide some protection for the stabs during transport and when installed the legs sit against the wall box or the meter socket to ensure correct positioning of the meter.

The 2-pole contactor of FIG. 17 is similar to the contactor shown in FIG. 5 and described hereinbefore. The contactor 10 has a symmetric layout with two switches 12 having steel-enhanced blade sets, and a centrally-placed solenoid 16 driving a lifter 18 for opening the blade sets. The solenoid 16 is preferably of a long narrow construction, disposed between the two sets of blades, to allow the contactor to have a relatively small width, as required to fit between the meter sprung jaws so that the standard wall box and meter configuration can be used. The terminals 22, 24, of the contactor are connected between a sprung jaw on the meter outlet side and the load connection. This allows the meter stabs to be plugged into the sprung jaws in the conventional manner.

A wall box 80 fitted with a disconnect contactor 10 is shown in FIG. 17. The wall box has a meter socket arrange to receive stabs from a standard meter enclosure. The meter socket includes a plug-in terminals known as sprung jaws 82, 83. A supply cable 84 and a load cable 86 and shown entering the wall box and connecting to cable clamps 90 associated with the meter socket. The supply is a 2 phase supply with phase wires A1, A2 and an earth or neutral wire E. The earth wires are shown passing under the contactor where they are joined together. The supply phase wires A1, A2 connect to sprung jaws 82 in which meter stabs are to be plugged in to connect the supply directly to the meter. The meter stabs representing the outlet from the meter plug into sprung jaws 83 which are isolated from the cable connectors to which the load cable is connected. Instead, these isolated sprung jaws connect to terminals (here the movable terminals 24) of the contactor 10 and the other terminals (here the fixed terminals 22) of the contactor are connected to the cable connectors 92 to which the load phase wires A1', A2' are connected. Thus the supply is fed directly to the meter so that the meter electronics always has power available and the load is supplied from the meter via the disconnect contactor 10, allowing the load to be isolated without turning off the power to the meter.

An advantage of mounting the meter-disconnect contactor outside the meter and inside the wall-box, between the sprung jaws, is that it would be possible to control the switched "disconnect" sprung jaw connection, remotely and independently, of the meter control circuit itself, using telemetry or so-called "power-line-carrier" data transmission techniques, which are very well developed. It also allows for a simple arrangement to provide an independent remote connect/disconnect facility using a simple plug-in type mains meter without a built-in contactor, which is typically smaller and cheaper.

This "integrated" arrangement allows the separation of the meter and disconnect contactor so that repair or replacement of defective parts can be carried out quickly and easily without replacing additional parts which are still in good working order. It also allows for a remotely controlled "integrated" disconnect contactor in every wall-box installation for remote control of the domestic load connection.

In the description and claims of the present application, each of the verbs "comprise", "include", "contain" and "have", and variations thereof, are used in an inclusive sense, to specify the presence of the stated item but not to exclude the presence of additional items.

Although the invention is described with reference to one or more preferred embodiments, it should be appreciated by those skilled in the art that various modifications are possible. Therefore, the scope of the invention is to be determined by reference to the claims that follow.

The invention claimed is:

1. A meter and contactor assembly, comprising:
a 2-phase mains meter;
a meter enclosure accommodating the mains meter; and
a 2-pole power contactor, having two switches connected between four terminals for switching the current in the two phases,
wherein the meter has four meter terminals, a first two meter terminals are in the form of stabs which extend through a rear wall of the enclosure and arranged to be inserted in a plug-in terminal block of a wall box, and the contactor is fitted to an outer surface on the rear wall of the enclosure and disposed within a space defined by the terminals of the terminal block, a first two contactor terminals being in the form of stabs arranged to be inserted in respective terminals of the terminal block, a second two terminals of the contactor being connected to a second two terminals of the meter; and
wherein said contactor comprises a first terminal, a second terminal, a pair of movable arms having outer faces and connected to at least one of said first and second terminals, and ferrous plates attached to said outer faces of the pair of movable arms.

2. The assembly of claim 1, wherein the meter enclosure has four legs extending from the rear wall and arranged to limit the distance the stabs can be inserted into the plug-in terminals of the terminal block.

3. The assembly of claim 2, wherein the legs extend beyond the contactor.

4. The assembly of claim 2, wherein the legs are disposed laterally of the stabs and outside of a spaced defined by the stabs.

5. The assembly of claim 4, wherein each leg is disposed along side a respective stab.

6. A wall box and contactor assembly for a mains meter, comprising:
a housing;
a terminal block having plug-in terminals arranged to receive terminal stabs from a plug-in mains meter; and
a contactor fitted to the housing and connected to the terminal block, the contactor being disposed within a space defined by the plug-in terminals of the terminal block arranged to receive the terminal stabs of the mains meter;
wherein said contactor comprises a first terminal, a second terminal, a pair of movable arms having outer faces and connected to at least one of said first and second terminals, and ferrous plates attached to said outer faces of the pair of movable arms.

7. The assembly of claim 6, wherein the terminal block has a supply connection and a load connection, the supply connection is electrically connected to first terminals of the terminal block arrange to receive input terminal stabs of the mains meter, and the load connection is electrically connected to switched terminals of the contactor, and input terminals of the contactor are electrically connected to second terminals of the terminal block arranged to receive output terminal stabs of the mains meter, whereby, in use, the mains meter is directly connected to the supply and connected to the load via the contactor.

8. The assembly of claim 7, further comprising a mains meter releasably plugged into the terminal block.

9. The assembly of claim 6, wherein:
said first terminal is connected to a pair of fixed contacts on opposite faces of a fixed conductive member; and
said pair of movable arms of electrically conductive material are connected to the second terminal, and carry movable contacts at an end remote from the connection to the second terminal, the movable arms being arranged in aligned opposition to each other such that their remote ends are on either side of the fixed conductive member, with the movable contacts aligned with the fixed contacts, and are separated by a predetermined gap over a major portion of their length;
wherein the arrangement of the fixed member and movable arms are such that when the contacts are closed, current flowing through the movable arms and the ferrous plates produces induced magnetic-field attraction forces between the movable arms that urges the movable arms towards each other, thereby increasing the force pressing the movable contacts against the fixed contacts.

10. The assembly of claim 9, wherein the contactor comprises an actuating arrangement including a lifter having a wedge shaped member disposed between inner inclined surfaces of the movable arms, arranged to separate the movable arms so as to open the contacts, the lifter being movable from a first position in which the wedge shaped member separates the movable aims, to a second position where the wedge shaped member allows the arms to move freely towards each other.

11. The assembly of claim 10, wherein the actuating arrangement comprises a solenoid effecting movement of the lifter between the first and second positions, the solenoid being disposed between the switches and having a relatively narrow width.

12. The assembly of claim 10, wherein the contactor further comprises flexible tangs formed as a part of the movable arms, and pegs formed on the lifter, wherein when the lifter is in the second position, the pegs engage the flexible tangs and deflect the tangs inwardly, to enhance contact pressure and reduce bounce.

13. The assembly of claim 6, wherein:
the contactor is a 2-pole electrical contactor;
said first terminal is connected to a fixed contact on a face of a first fixed conductive member;
a first movable arm of said plurality of movable arms of electrically conductive material is connected to the second terminal, and carries a movable contact at an end remote from the connection to the second terminal, the movable contact and the fixed contact forming a first switch and being arranged in first switch pair of contacts;
said contactor further comprising:
a third terminal connected to a fixed contact on a face of a second fixed conductive member;
a fourth terminal;
a second movable arm of said plurality of movable arms of electrically conductive material is connected to the fourth terminal, and carries a movable contact at an end remote from the connection to the fourth terminal, the movable contact and the fixed contact forming a second switch and being arranged in a second switch pair of contacts; and an actuating arrangement arranged to move the movable arms so as to open and close the switches, wherein the actuating arrangement is arranged to close the first switch pair of contacts after closing the second switch pair of contacts.

14. The assembly of claim 13, wherein the contacts of at least the first pair of switching contacts have a tungsten rich top-layer.

15. The assembly of claim 1, wherein said first terminal is connected to a pair of fixed contacts on opposite faces of a fixed conductive member; and said pair of movable arms of electrically conductive material are connected to the second terminal, and carries movable contacts at an end remote from the connection to the second terminal, the movable arms being arranged in aligned opposition to each other such that their remote ends are on either side of the fixed conductive member, with the movable contacts aligned with the fixed contacts, and are separated by a predetermined gap over a major portion of their length;

wherein the arrangement of the fixed member and movable arms are such that when the contacts are closed, current flowing through the movable arms and the ferrous plates produces induced magnetic-field attraction forces between the movable anus that urges the movable arms towards each other, thereby increasing the force pressing the movable contacts against the fixed contacts.

16. The assembly of claim 15, wherein the contactor comprises an actuating arrangement including a lifter having a wedge shaped member disposed between inner inclined surfaces of the movable arms, arranged to separate the movable arms so as to open the contacts, the lifter being movable from a first position in which the wedge shaped member separates the movable arms, to a second position where the wedge shaped member allows the arms to move freely towards each other.

17. The assembly of claim 16, wherein the actuating arrangement comprises a solenoid effecting movement of the lifter between the first and second positions, the solenoid being disposed between the switches and having a relatively narrow width.

18. The assembly of claim 16, wherein the contactor further comprises flexible tangs formed as a part of the movable arms, and pegs formed on the lifter, wherein when the lifter is in the second position, the pegs engage the flexible tangs and deflect the tangs inwardly, to enhance contact pressure and reduce bounce.

19. The assembly of claim 1, wherein:

the contactor is a 2-pole electrical contactor;

said first terminal is connected to a fixed contact on a face of a first fixed conductive member; and a first movable arm of said plurality of movable arms of electrically conductive material is connected to the second terminal, and carries a movable contact at an end remote from the connection to the second terminal, the movable contact and the fixed contact forming a first switch and being arranged in first switch pair of contacts;

said contactor further comprising:

a third terminal connected to a fixed contact on a face of a second fixed conductive member;

a fourth terminal;

a second movable arm of said plurality of movable arms of electrically conductive material connected to the fourth terminal, and carries a movable contact at an end remote from the connection to the fourth terminal, the movable contact and the fixed contact forming a second switch and being arranged in a second switch pair of contacts; and an actuating arrangement arranged to move the movable arms so as to open and close the switches, wherein the actuating arrangement is arranged to close the first switch pair of contacts after closing the second switch pair of contacts.

\* \* \* \* \*